(12) United States Patent
Park

(10) Patent No.: US 8,252,661 B2
(45) Date of Patent: Aug. 28, 2012

(54) METHOD OF FABRICATING FLASH MEMORY DEVICE

(75) Inventor: Sung Kee Park, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 109 days.

(21) Appl. No.: 12/781,777

(22) Filed: May 17, 2010

(65) Prior Publication Data

US 2010/0291750 A1    Nov. 18, 2010

Related U.S. Application Data

(62) Division of application No. 11/479,330, filed on Jun. 30, 2006, now Pat. No. 7,719,061.

(30) Foreign Application Priority Data

Aug. 8, 2005 (KR) .......................... 10-2005-0072323

(51) Int. Cl.
*H01L 21/76* (2006.01)
(52) U.S. Cl. ....................................................... 438/427
(58) Field of Classification Search .................. 438/207, 438/211, 424, 427; 251/E21.546, 315; 365/185.1; 257/E21.546, 315, 314, 316
See application file for complete search history.

(56) References Cited

U.S. PATENT DOCUMENTS

| | | | | |
|---|---|---|---|---|
| 5,946,230 A * | 8/1999 | Shimizu et al. | .......... | 365/185.01 |
| 6,340,611 B1 * | 1/2002 | Shimizu et al. | ................ | 438/201 |
| 6,351,002 B1 | 2/2002 | Pan | | |
| 6,690,608 B2 | 2/2004 | Nii et al. | | |
| 6,765,260 B1 * | 7/2004 | Hung et al. | .................... | 257/315 |
| 6,833,622 B1 | 12/2004 | Zagrebelny et al. | | |
| 6,844,590 B2 * | 1/2005 | Goda et al. | ..................... | 257/326 |
| 6,878,988 B1 * | 4/2005 | Lee et al. | ....................... | 257/324 |
| 7,084,477 B2 * | 8/2006 | Ishitsuka et al. | .............. | 257/501 |
| 2004/0029372 A1 | 2/2004 | Jang et al. | | |
| 2004/0195626 A1 | 10/2004 | Yamada et al. | | |
| 2005/0139905 A1 | 6/2005 | Jung | | |

FOREIGN PATENT DOCUMENTS

| | | |
|---|---|---|
| JP | 10-173035 | 6/1998 |
| JP | 10-335333 | 12/1998 |
| JP | 2004-015056 | 1/2004 |

OTHER PUBLICATIONS

SIPO, The First Office Action, Application No. 2006101081124, May 9, 2008.

* cited by examiner

*Primary Examiner* — Thinh T Nguyen
(74) *Attorney, Agent, or Firm* — Kilpatrick Townsend & Stockton LLP

(57) ABSTRACT

A semiconductor device includes a semiconductor substrate having a cell region and a peripheral region. A cell array is defined within the cell region, the cell array having first, second, third, and fourth sides. A first decoder is defined within the peripheral region and provided adjacent to the first side of the cell array. A first isolation structure is formed at a first boundary region provided between the first side of the cell array and the peripheral region. A first active region is formed at a second boundary region that is provided between the second side of the cell array and the peripheral region. The first isolation structure has a first portion that has a first depth and a second portion that has a second depth.

8 Claims, 3 Drawing Sheets

METHOD OF FABRICATING FLASH MEMORY DEVICE

CROSS-REFERENCES TO RELATED APPLICATIONS

The present application is a divisional of U.S. patent application Ser. No. 11/479,330, filed on Jun. 30, 2006 now U.S. Pat. No. 7,719,061, which claims priority to Korean patent application number 2005-72323, filed on Aug. 8, 2005, both of which are incorporated by reference.

BACKGROUND OF THE INVENTION

The present invention relates to a memory device and method of fabricating the same, and more particularly, to forming a boundary region between cell and peripheral regions in the memory device.

In the memory device, e.g., the NAND flash, the pitch of the isolation trench is becoming smaller and smaller as the technology advances. The isolation trench is gap-filled with an oxide film to form field oxide structure (FOX) or isolation structure. Such an oxide film is typically formed using High Density Plasma (HDP) method. The step-coverage failure of the isolation structure is more likely to occur as the isolation trench is provided with a smaller pitch.

The step-coverage failure in the memory cell region can be quite serious. The step-coverage failure may generate a void in the isolation structure of the memory cell that can affect the reliability of the memory cell. To address this concern, the depth of an isolation trench of the memory cell region is set to 2000 Å or less in order to improve the step coverage.

However, the depth of the isolation trench at the peripheral region tends to be substantially deeper. That is, the voltage applied to the peripheral components of the device generally has not changed even as the technological advance has greatly reduced the size of the device. Accordingly, a transistor formed in the peripheral region continues to be provided with a deep isolation trench to withstand a high voltage of 20V or more.

Currently a boundary region between the cell region and the peripheral region is defined by forming an active region or forming an isolation layer. If the active region is formed, a gate oxide layer thinning phenomenon may occur at an edge of the active region. If a high voltage of about 20V is applied to the gate line during a NAND flash memory device operation, the gate oxide breakdown could occur at the thinned-out portion of the gate oxide layer. This would result in device failure.

BRIEF SUMMARY OF THE INVENTION

The present invention relates to forming a boundary between the cell and peripheral regions in a memory device. In one embodiment, a semiconductor device includes a semiconductor substrate having a cell region and a peripheral region. A cell array is defined within the cell region, the cell array having first, second, third, and fourth sides. A first decoder is defined within the peripheral region and provided adjacent to the first side of the cell array. A first isolation structure is formed at a first boundary region provided between the first side of the cell array and the peripheral region. A first active region is formed at a second boundary region that is provided between the second side of the cell array and the peripheral region. The first isolation structure has a first portion that has a first depth and a second portion that has a second depth.

In another embodiment, a gate line is provided over the first boundary region, wherein a gate line is not provided over the second boundary region. A well pickup region provided at the second boundary region. The substrate has a well region formed within the cell region, the well pickup region having a higher dopant concentration than the well region provided in the cell region. A second decoder is defined within the peripheral region and provided adjacent to the third side of the cell array. A second active region is formed at a third boundary region provided between the third side of the cell array and the peripheral region. A second gate line is provided over the third boundary region.

In another embodiment, a method for forming a semiconductor device includes providing a semiconductor substrate having a cell region and a peripheral region. The cell region has a cell array with first, second, third, and fourth sides. The cell array has a first decoder at a first boundary provided between the first side of the cell array and the peripheral region. A first isolation structure is formed at a first boundary region defined between the first side of the cell array and the peripheral region. A first active region is formed at a second boundary region defined between the second side of the cell array and the peripheral region. A first gate line is formed over the first boundary region. A well pickup region is formed within the active region after the isolation structure and the active region have been formed. The well pickup region is formed using the same impurity as that of a well region formed within the cell region.

In yet another embodiment, the first-isolation-structure is formed by etching a first trench to form a first portion of the first isolation structure, the first trench having a first depth; and etching a second trench to form a second portion of the first isolation structure, the second trench having a second depth. The first and second trenches define an abrupt interface that can damage the semiconductor substrate during a subsequent thermal process.

DETAILED DESCRIPTION OF THE INVENTION

The present invention relates to forming a boundary region between a cell region and a peripheral region in a memory device, e.g., a NAND flash memory device. The type of the boundary region formed depends on whether or not a gate line is provided over the boundary region according to embodiments of the present invention. For example, a field oxide structure (FOX) is formed if a gate line is provided over the boundary region, and an active region is formed when a gate line is not provided over the boundary region.

Figure 1:
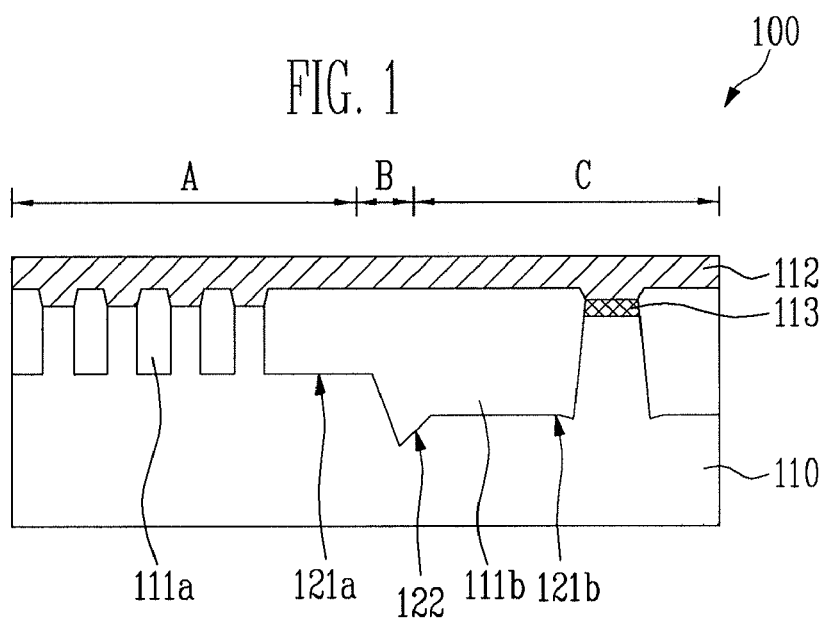
FIG. 1 illustrates a cross-sectional view of a flash memory device having an isolation structure at a boundary region between a cell region and a peripheral region according to one embodiment of the present invention.

FIG. 1 illustrates a cross-sectional view of a flash memory device 100 having an isolation structure 111b at a boundary region B between a cell region A and a peripheral region C according to one embodiment of the present invention. The flash memory device 100 has a semiconductor substrate 110, a plurality of isolation structures 111a in the cell region A, an isolation structure 111b at the boundary region B, a gate line 112, and a well pickup region 113 in the peripheral region C.

The well pickup region 113 is used to uniformly distribute the bias during an erase operation of the flash memory device. In the present embodiment, the well pickup region is formed by implanting the same impurity (or dopant), e.g., boron, as that used to form other well regions on the substrate (e.g., in the cell region). The impurity concentration of the well pickup region is higher than that of the well region in the cell region. For example, the impurity concentration for the well pickup region is 5E14 to 5E15 ions/cm$^2$ in the present embodiment.

The memory device 100 has the isolation structure (or FOX) 111b at the boundary region B because the gate line 112 is provided over the boundary region. A gate oxide layer (not shown) formed below the gate line 112 may thin-out at an edge of the boundary region if an active region is formed at the boundary region. This thinning effect may result in the gate oxide breakdown when a high voltage is applied to the gate line.

However, forming a large isolation structure, such as the isolation structure 111b, at the boundary region B has certain undesirable effects. The isolation structure 111b comprises of a first portion 121a and a second portion 121b. The first portion 121a is formed by filling a first isolation trench associated with the cell region, and the second portion 121b is formed by filling a second isolation trench associated with the peripheral region. The first and second isolation trenches have different depths and are formed by using two different etch steps. As a result, an abrupt "V-like" shape (or interface) 122 is formed at the area where the first and second isolations trenches meet. This abrupt interface 122 may cause defects in the silicon substrate during the subsequent thermal processes.

In addition, the isolation structure 111b may experience dishing and form a groove thereon when it is polished due to its large lateral size. Polysilicon residues may be formed within the groove when a self-aligned floating gate process is performed subsequently. Size of the groove generally corresponds to the lateral size of the isolation structure 111b. Accordingly, to minimize the polysilicon residue formation, the lateral size of the isolation structure 111b (or distance between the memory cell region A and the well pickup region 113) should be reduced. Preferably, the isolation structure 111b should not be used when its use is not necessary.

Figure 2:
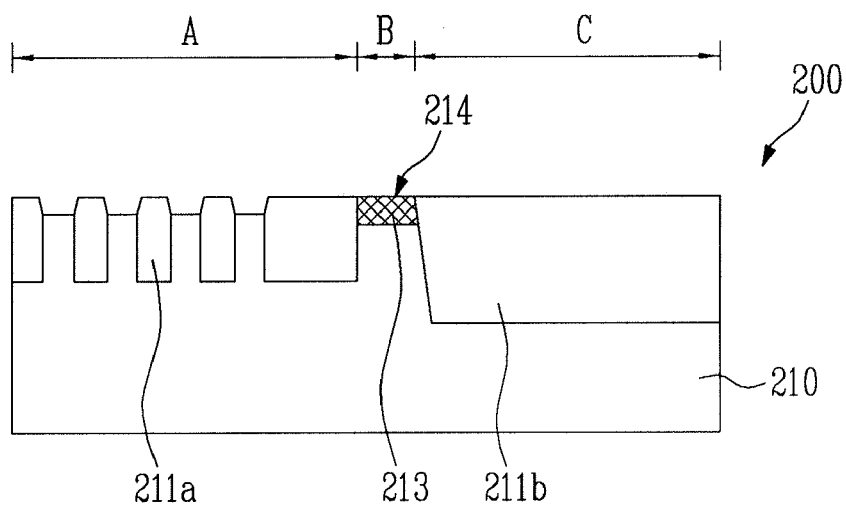
FIG. 2 illustrates a cross-sectional view of a boundary region of a memory cell region and a peripheral region that would not have a gate line provided over the boundary region according to one embodiment of the present invention.

FIG. 2 illustrates a cross-sectional view of a flash memory device 200 having an active region 201 at a boundary region B between a cell region A and a peripheral region C according to one embodiment of the present invention. Note a gate line is not provided over the boundary region B unlike in the device 100 in FIG. 1. Accordingly, the active region is used instead of the isolation structure since there is no risk of the gate oxide breakdown at the boundary region. In the present embodiment, the active region is formed at the boundary region B when a gate line is not to be formed over the boundary region B.

Referring back to FIG. 2, the flash memory device 200 has a semiconductor substrate 210, isolation structures 211a in the cell region, an isolation structure 211b in the peripheral region C, an active region 214 at the boundary region, and a well pickup region 113 at the boundary region B.

In the present embodiment, the active region 213 also serves as the well pickup region 213 to reduce the device size. As explained above, the well pickup region is used to uniformly distribute the bias during an erase operation of the flash memory device. The impurity concentration of the well pickup region 213 is higher than that of the well region in the cell region. The impurity concentration of the well pickup region 213 is 5E14 to 5E15 ions/cm$^2$.

The device size can be reduced by forming the well pickup region 213 in the boundary region B as part of the active region 214. In the related art, the active region and the well pickup region are formed at separate regions. For example, the active region and the well pickup region are spaced apart from each other by about 2 μm. The device size can be reduced accordingly if both the active region and the well pickup region are formed in the same boundary region.

In one embodiment, the active region and the isolation structure are formed at different boundary regions of a cell array. The active region is formed at a first boundary region (or a first side of the cell array) that does not have a gate line provided over it, whereas the isolation structure is formed at a second boundary region (or a second side of the cell array) that has a gate line provided over it. That is, a given cell array of a semiconductor device of the present embodiment has both types of the structures illustrated in FIGS. 1 and 2 at different boundary regions.

Figure 3A:
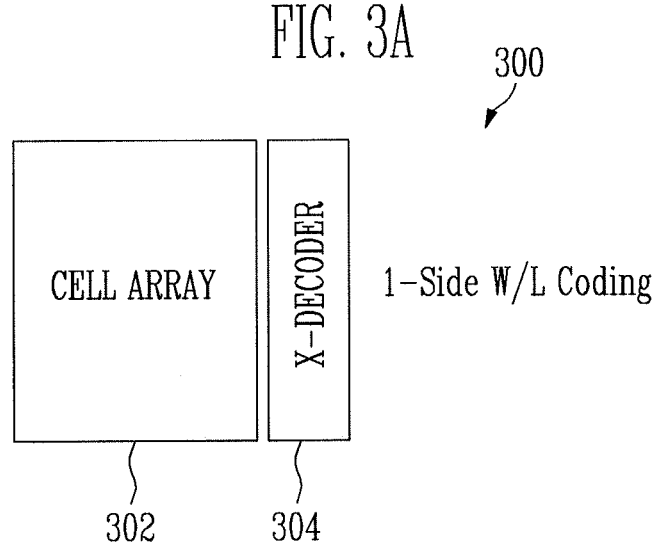
FIG. 3A shows a cell array having a one-side word line (W/L) coding structure.

FIG. 3A shows a memory device 300 having a cell array 302 having a one-side word-line (W/L) coding structure. The cell array 302 has four sides. A decoder 304 is provided in the peripheral region of the memory device 300 and adjacent to one of the four sides of the cell array 302. The decoder 304 is an X-decoder.

Figure 3B:
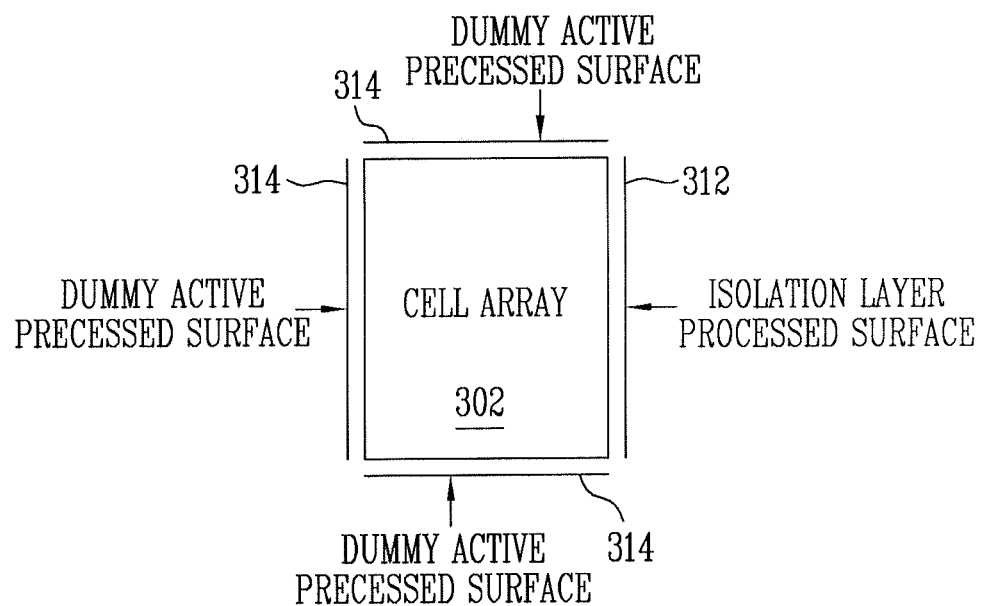
FIG. 3B shows boundary regions of a cell array having a one-side W/L coding structure according to one embodiment of the present invention.

FIG. 3B shows the formation of a plurality of boundary regions of the cell array 302 according to one embodiment of the present invention. An isolation structure 312 is formed at the side of the cell array where the decoder 304 is provided since a gate line would be provided over that boundary region. Active regions 314 are formed at other three boundary regions since the gate line would not be provided over these boundary regions. A well pickup region (not shown) is provided within one or more of the active regions in the present embodiment.

Figure 4A:
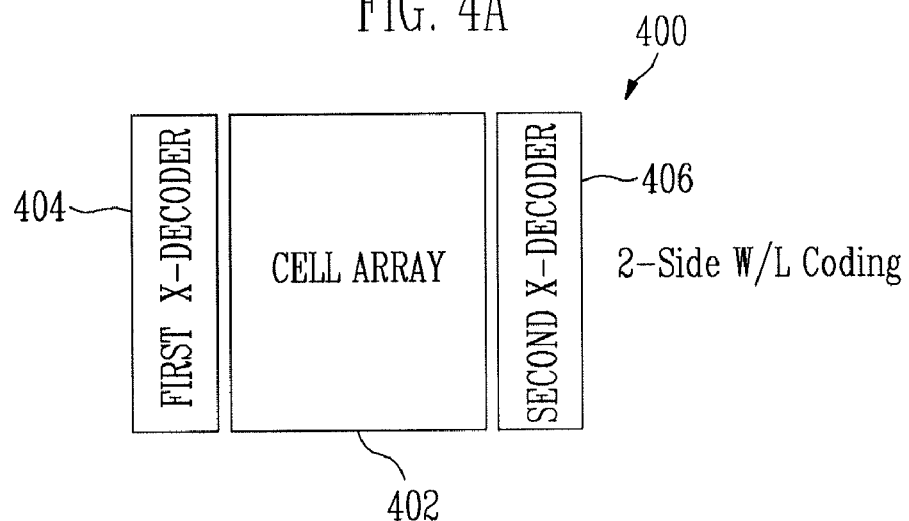
FIG. 4A shows a cell array having two-side W/L coding structure.

FIG. 4A shows a memory device 400 having a cell array 402 having a two-side word-line (W/L) coding structure. The cell array 402 has four sides. A first decoder 404 is provided at one of the four sides of the cell array 402. A second decoder 406 is provided at another side of the cell array 402. Both of these decoders are provided in the peripheral regions of the memory device 400.

Figure 4B:
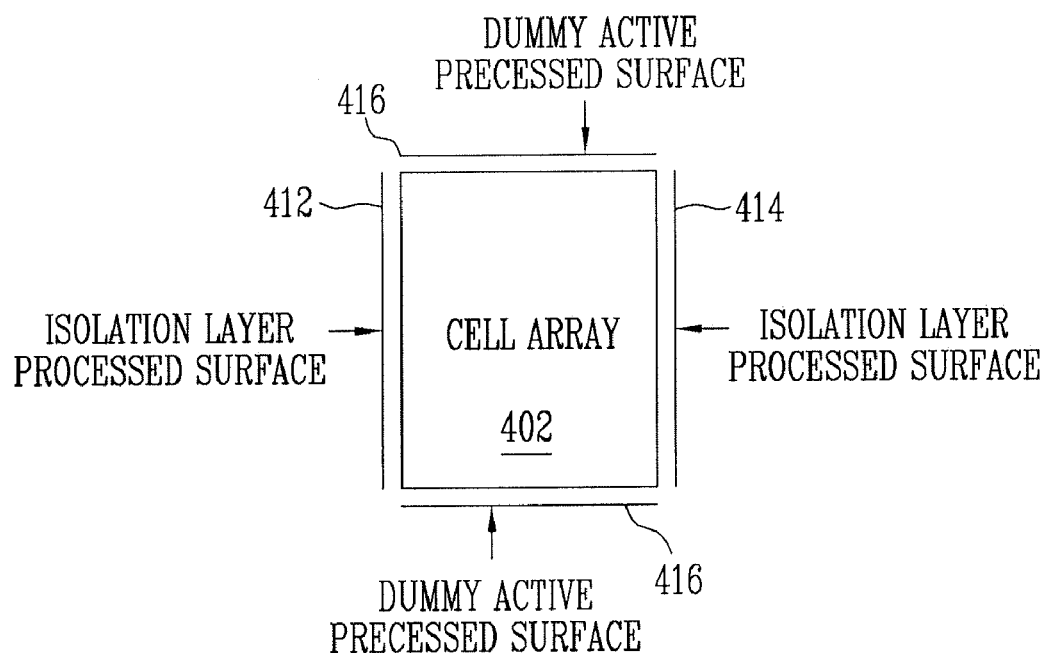
FIG. 4B shows boundary regions of a cell array having two-side W/L coding structure according to one embodiment of the present invention.

FIG. 4B shows the formation of a plurality of boundary regions of the cell array 402 according to one embodiment of the present invention. First and second isolation structures 412 and 414 are formed at the sides of the cell array where the first and second decoders 404 and 406 are formed since gate lines would be provided over those boundary regions. Active regions 416 are formed at other two boundary regions since the gate line would not be provided over these boundary regions. A well pickup region (not shown) is provided within one or more of the active regions in the present embodiment.

As described above, the embodiments of the present invention has one or more of the following advantages. First, the gate oxide breakdown is reduced since an isolation structure is formed at a boundary region if a gate line is to be provided over that boundary region. Second, an active region is formed at a boundary region if a gate line is not to be provided over that boundary region to minimize the likelihood of damage to the semiconductor substrate during a subsequent thermal process. Third, the well pickup region is formed within the active region to reduce the device size.

The above embodiments of the present invention are illustrative and not limitative. Various alternatives and equivalents are possible. The invention is not limited by the type of deposition, etching, polishing, and patterning steps described herein. Nor is the invention limited to any specific type of semiconductor device. For example, the present invention has been described above in terms of a NAND flash memory device, but the present invention may be implemented in a NOR flash memory device or other memory devices. Other additions, subtractions, or modifications are obvious in view of the present disclosure and are intended to fall within the scope of the appended claims.

What is claimed is:

1. A method for forming a semiconductor device, the method comprising:
    providing a semiconductor substrate having a cell region, a peripheral region, and a boundary region including a gate line region, wherein the boundary region is disposed between the cell region and the peripheral region;
    forming a first isolation structure disposed in the peripheral region, a second isolation structure disposed in the cell region, and a field oxide structure disposed in the gate line region of the boundary region, thereby forming an active region in a portion of the boundary region except the gate line region of the boundary region; and
    forming a gate line over the field oxide structure so that the gate line is not formed over the active region.

2. The method of claim 1, further comprising:
    forming a well pickup region within the active region after the first and second isolation structures and field oxide structure have been formed.

3. The method of claim 2, wherein the well pickup region is formed using the same impurity as that of a well region formed within the cell region.

4. The method of claim 3, wherein the well pickup region has a higher impurity concentration than that of the well region in the cell region.

5. The method of claim 3, wherein an impurity concentration of the well pickup region is 5E14 to 5E15 ions/cm$^2$.

6. The method of claim 1, wherein the forming the first and second isolation structures and field oxide structure step comprises:
    etching the semiconductor substrate of the peripheral region to form a first trench of the first isolation structure, the first trench having a first depth; and
    etching the semiconductor substrate of the cell region to form a second trench of the second isolation structure, the second trench having a second depth.

7. The method of claim 1, wherein the cell region includes first, second, third, and fourth sides,
    wherein the gate line region is adjacent to the first side of the cell region,
    wherein the field oxide structure is formed in the boundary region between the first side of the cell region and the peripheral region, and
    wherein the active region is formed in the boundary region between the second, third, and fourth sides of the cell region and the peripheral region.

8. The method of claim 1, wherein the cell region includes first, second, third, and fourth sides,
    wherein the gate line region is adjacent to the first and second sides of the cell region,
    wherein the field oxide structure is formed in the boundary region between the first and second sides of the cell region and the peripheral region, and
    wherein the active region is formed in the boundary region between the third and fourth sides of the cell region and the peripheral region.

* * * * *